(12) United States Patent
Peng et al.

(10) Patent No.: US 7,443,672 B2
(45) Date of Patent: Oct. 28, 2008

(54) VIDEO GRAPHICS ARRAY (VGA) CARD ASSEMBLY

(75) Inventors: Xue-Wen Peng, Shenzhen (CN); Rui-Hua Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 71 days.

(21) Appl. No.: 11/309,818

(22) Filed: Oct. 3, 2006

(65) Prior Publication Data

US 2008/0080143 A1    Apr. 3, 2008

(51) Int. Cl.
*H05K 7/20* (2006.01)
*F28F 7/00* (2006.01)

(52) U.S. Cl. .................. 361/695; 165/104.33; 361/700; 361/719

(58) Field of Classification Search .................. 361/700
See application file for complete search history.

(56) References Cited

U.S. PATENT DOCUMENTS

| | | | |
|---|---|---|---|
| 6,549,404 B1 * | 4/2003 | Kitahara et al. ............. | 361/695 |
| 6,671,177 B1 | 12/2003 | Han | |
| 6,717,811 B2 | 4/2004 | Lo et al. | |
| 6,723,917 B1 * | 4/2004 | Wang .......................... | 174/383 |
| 6,795,315 B1 * | 9/2004 | Wu et al. ..................... | 361/695 |
| 6,836,412 B2 * | 12/2004 | Kim et al. .................... | 361/796 |
| 6,937,474 B2 * | 8/2005 | Lee ............................. | 361/715 |
| 7,002,797 B1 * | 2/2006 | Wittig ......................... | 361/695 |
| 7,265,974 B2 * | 9/2007 | Lopatinsky et al. ......... | 361/697 |
| 7,283,364 B2 * | 10/2007 | Refai-Ahmed et al. ...... | 361/719 |
| 7,321,494 B2 * | 1/2008 | Han ............................ | 361/719 |
| 2005/0061477 A1 * | 3/2005 | Mira .......................... | 165/80.3 |
| 2006/0164808 A1 * | 7/2006 | Stefanoski .................. | 361/700 |
| 2007/0171611 A1 * | 7/2007 | Peng et al. .................. | 361/695 |

\* cited by examiner

*Primary Examiner*—Gregory D Thompson
(74) *Attorney, Agent, or Firm*—Frank R. Niranjan

(57) ABSTRACT

A VGA card assembly includes a VGA card (90) having a heat-generating electronic component (94) mounted thereon and a heat dissipating device thermally connecting with the electronic component. The assembly includes a flow director (50) defining a receiving room (57) therein. A thermal module (10) is received in the receiving room. A bottom of the thermal module contacts with the heat-generating electronic component. A cover (80) is movably mounted on the flow director to cover the thermal module in the flow director. The cover is capable of rotating or sliding relative to the flow director to facilitate open or close of the receiving room. When the receiving room is opened, the thermal module is exposed.

20 Claims, 9 Drawing Sheets

VIDEO GRAPHICS ARRAY (VGA) CARD ASSEMBLY

FIELD OF THE INVENTION

The present invention relates to a video card assembly and particularly a video card assembly having a heat dissipation device mounted thereon which having a cover movably mounted thereon to facilitate assembly/disassembly of the heat dissipation device.

DESCRIPTION OF RELATED ART

In order to enable desktop and other computers to rapidly process graphics and game technology, add-on units, generally referred to as "graphics cards" or "VGA cards", are often installed in computer devices. Such cards include a separate processor, called a GPU (graphics processor unit). The GPU generates a large amount of heat during operation. When the temperature of the GPU exceeds a certain level, the GPU may malfunction, or in the worst case fail outright. For this reason, a heat dissipation device is commonly required to be installed on the GPU to dissipate the heat generated by the GPU and other electronic components adjacent to it into ambient air. U.S. Pat. Nos. 6,671,177 and 6,717,811 each teach such a heat dissipation device. This kind of heat dissipation device generally comprises a base and a plurality of fins mounted on the base. The base is attached on the GPU mounted on the VGA card so as to absorb the heat therefrom. A fan is installed at a lateral side of the fins to blow air through channels of the fins, thereby taking heat away from the fins. A lid is screwedly mounted on the base to cover the fins and the fan. It is necessary to bore holes in the lid for permitting screws to extend through the lid. As a result, the holes affect appearance of the lid. Moreover, the mounting of the lid on the base by the screws makes it time-consuming, cumbersome and inconvenient to assemble/disassemble the heat dissipation device.

SUMMARY OF THE INVENTION

According to a preferred embodiment of the present invention, a VGA card assembly includes a VGA card having a heat-generating electronic component mounted thereon and a heat dissipating device mounted on the VGA card. The heat dissipating device includes a flow director defining a receiving room therein and a thermal module received in the receiving room. A bottom of the thermal module contacts with the heat-generating electronic component. A cover is movably mounted on the flow director to cover the thermal module in the flow director. The cover is capable of rotating or sliding relative to the flow director to facilitate open and close of the receiving room. When the cover is moved to open the receiving room, a user can access the thermal module.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
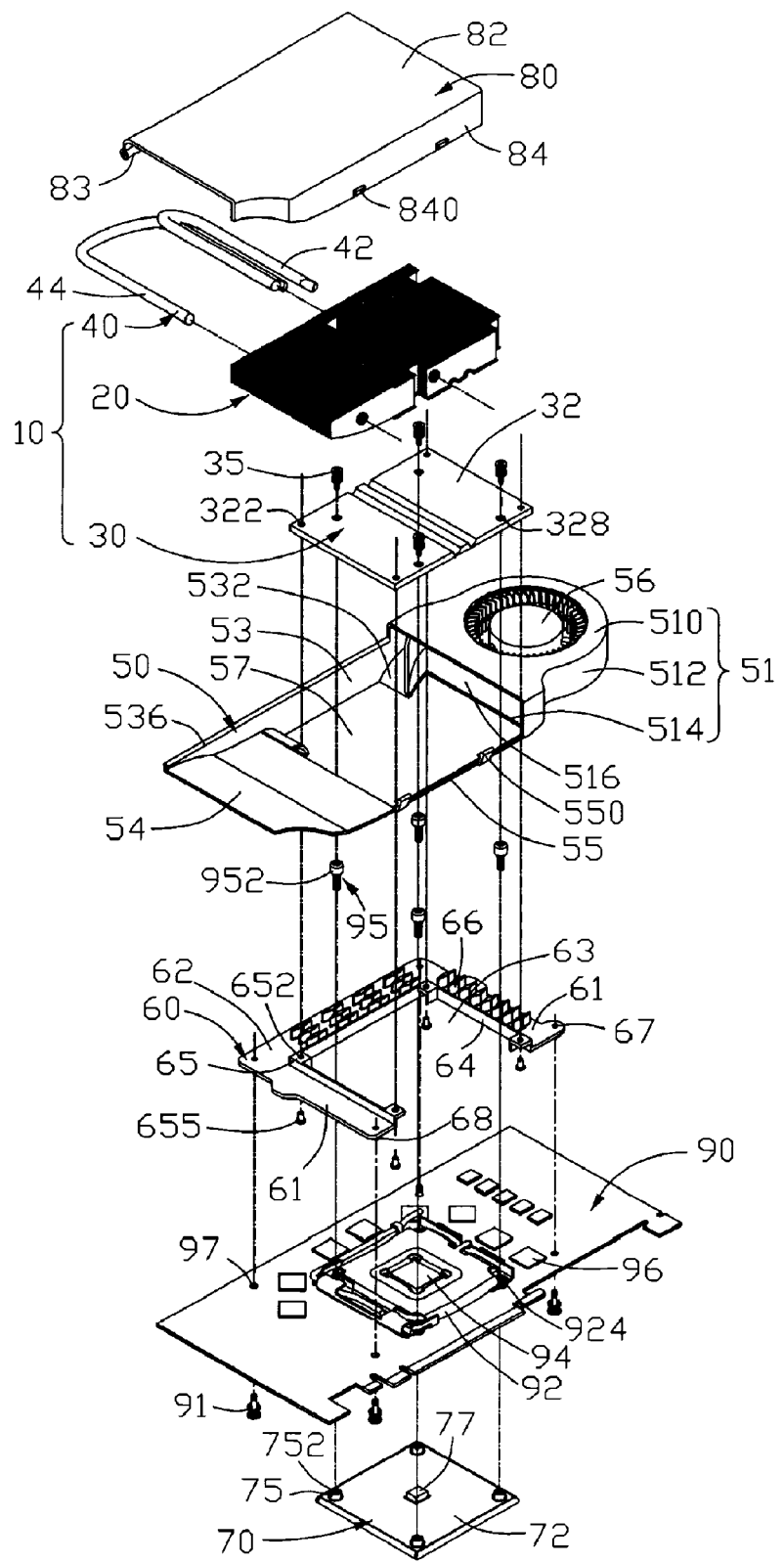
FIG. 1 is an exploded, isometric view of a VGA card assembly according to a preferred embodiment of the present invention.
Figure 2:
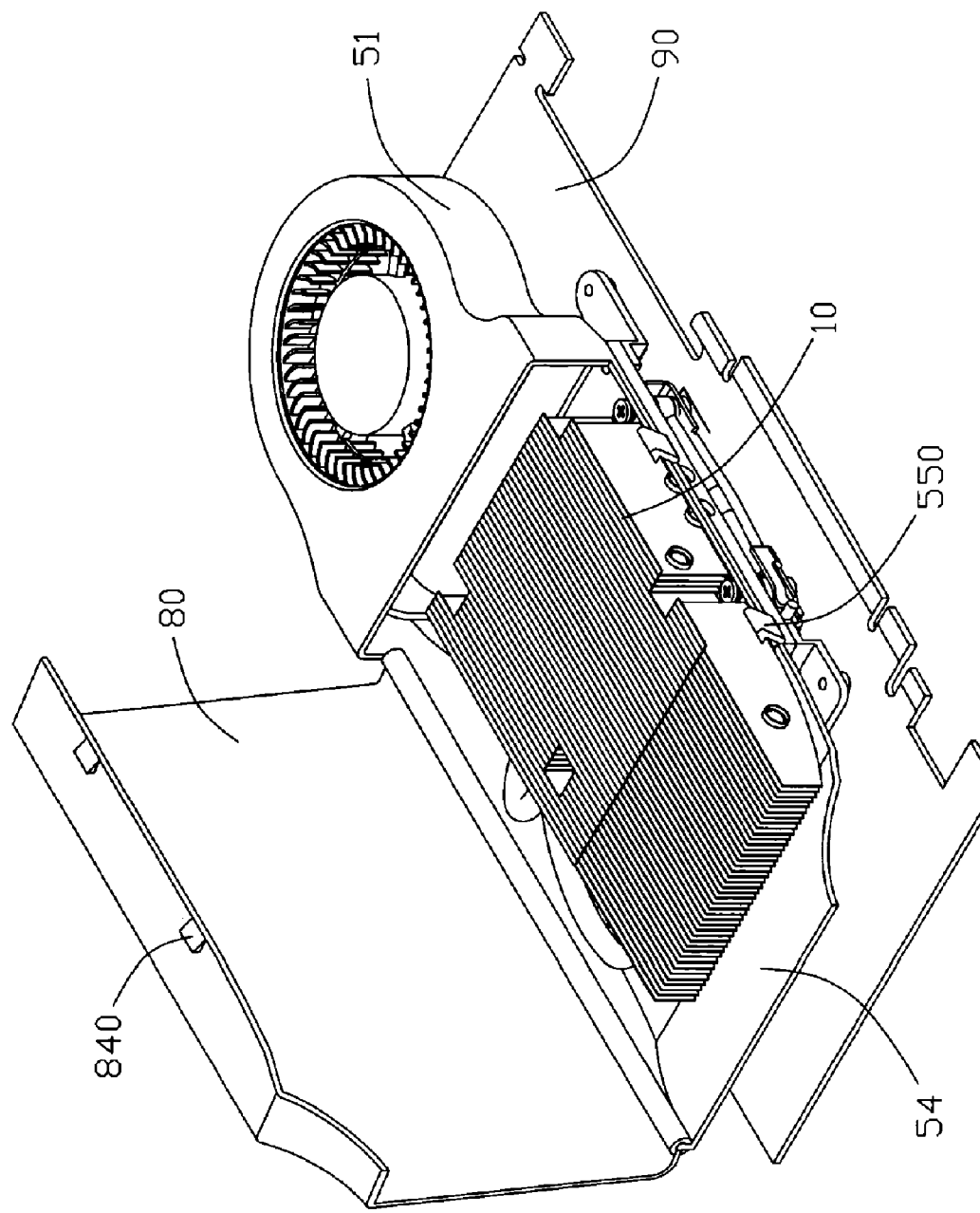
FIG. 2 is an assembled view of FIG. 1, showing a cover of the VGA card assembly in an opened position.
Figure 3:
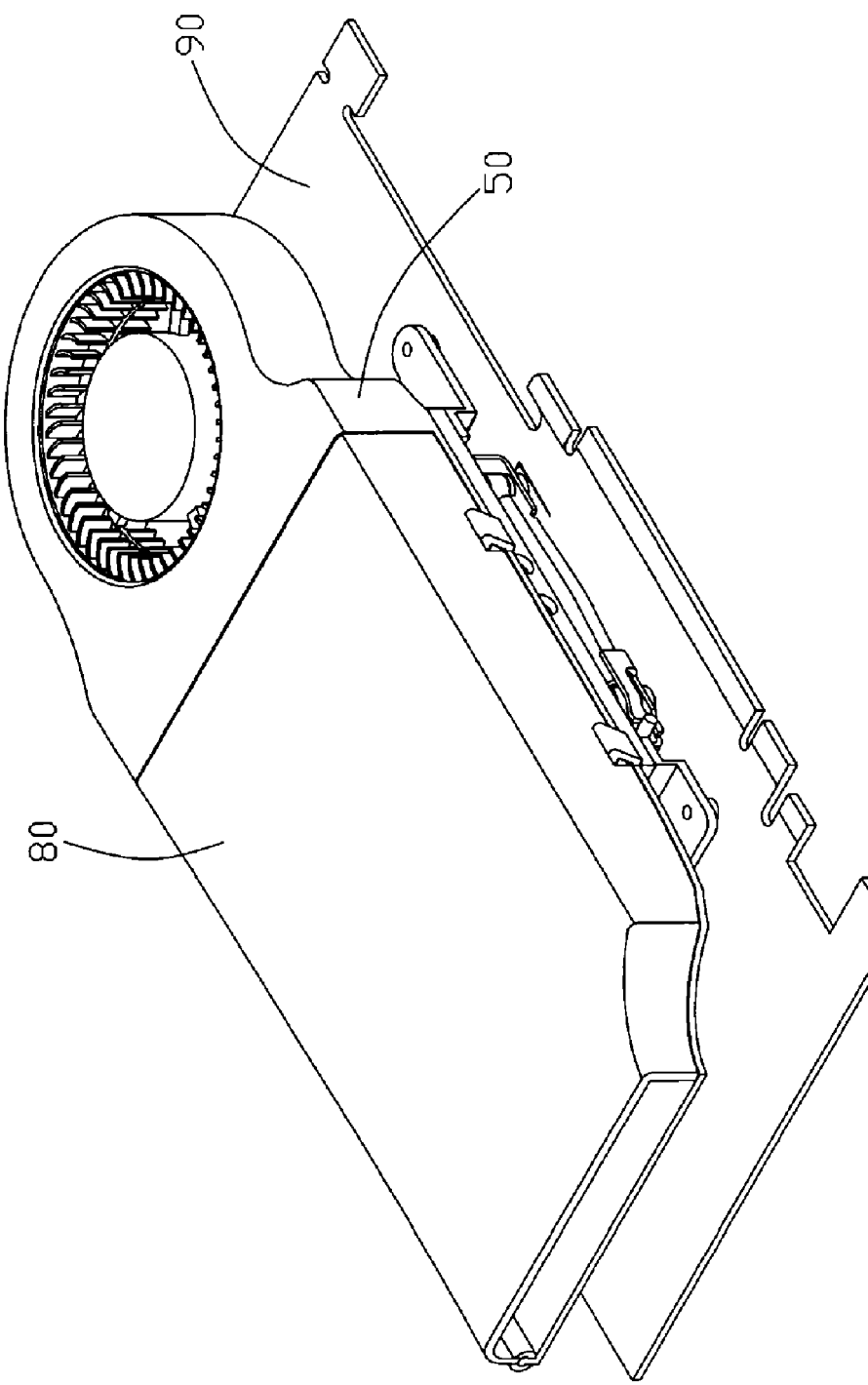
FIG. 3 is a view similar to that of FIG. 2, but showing the cover in a closed position.

Referring to FIGS. 1-3, a VGA card assembly in accordance with a first embodiment of the present invention is illustrated, and comprises a VGA card 90, a heat dissipation device (not labeled) mounted on the VGA card 90 and a back plate 70 mounted below the VGA card 90.

The VGA card 90 has a socket 92 attached on a top surface thereof. The socket 92 has an approximately rectangular shape. Four corners of the socket 92 are installed with respective sleeves 924. Each sleeve 924 defines a through hole (not labeled) therein, which is defined through the socket 92 and the VGA card 90. A graphics processor unit (GPU) 94 is mounted on a center of the socket 92 and connected electrically with the VGA card 90. A plurality of electronic components 96 are located around the GPU 94.

The back plate 70 is installed below the VGA card 90, and has an approximately square shape. Four corners of the back plate 70 are provided with respective studs 75. The stud 75 has internal threads 752 therein. The back plate 70 forms a protrusion 77 at a central portion thereof. The protrusion 77 extends upwardly for supporting the GPU 94 mounted on the VGA card 90 to prevent the VGA card 90 from being deformed downwardly. Four fastening members 95 have upper inner-threaded portions 952 and lower outer-threaded portions (not labeled). The lower outer-threaded portions are brought to extend downwardly through the through holes of the sleeves 924 of the socket 92, and protrude downwardly from the VGA card 90. Then the lower outer-threaded portions of the fasteners 95 are screwed into the internal threads 752 of the studs 75. Thus, the back plate 70 is combined to a bottom of the VGA card 90.

The heat dissipation device is mounted onto the VGA card 90 for dissipating heat generated by the GPU 94 and the other electronic components 96 to achieve effective heat dissipation thereof. The heat dissipation device mainly comprises a mounting bracket 60, a flow director 50 attached to the mounting bracket 60, a thermal module 10 received in the flow director 50 and a removable cover 80 pivotably mounted on the flow director 50.

The mounting bracket 60 consists of three elongated bodies, i.e., a pair of opposite parallel transverse bodies 61 and a longitudinal body 62 perpendicularly interconnecting the transverse bodies 61. Four through holes 67 are defined in four corners of the mounting bracket 60, located corresponding to four through holes 97 defined in the VGA card 90. Four screws 91 extend through the through holes 97 of the VGA card 90 to be threadedly engaged in the through holes 67 of the mounting bracket 60, whereby the mounting bracket 60 is mounted on the VGA card 90. The mounting bracket 60 defines an opening 63 enclosed by three bodies 61, 62 for receiving the socket 92 with the GPU 94 therein. A plurality of vanes 66 extend upwardly from two adjacent bodies 61, 62 for dissipating heat generated by the electronic components 96 located around the GPU 94. Three lips 64 extend upwardly from inner edges of three bodies 61, 62. Four tabs 65 having through holes 652 defined therein are formed at corners of the lips 64.

The flow director 50 comprises a fan carrier 51 receiving a fan 56 therein, a baffle plate 53, a flange 55 opposing to the baffle plate 53 and an inclined mounting plate 54 connecting the baffle plate 53 and the flange 55. The fan carrier 51 consists of a top wall 510, an arced sidewall 512 extending downwardly from an edge of the top wall 510 and a bottom wall 514 spaced from the top wall 510 and connecting with a bottom of the sidewall 512. The top wall 510 and the bottom wall 514 each have a circular portion (not labeled). The top wall 510 defines an intake (not labeled) therein. The fan 56 is received in the fan carrier 51 and is aligned with the intake through which the fan 56 can draw cooling air into the fan carrier 51. An outlet 516 is defined at a lateral side of the fan carrier 51, through which the cooling air can leave the fan carrier 51. The baffle plate 53 and the flange 55 integrally extend from two opposite ends of the sidewall 512 of the fan carrier 51. An elongate shaft 536 is formed on a top edge of the baffle plate 53. A pair of clasps 550 is formed on the flange 55 for clasping with the cover 80. A receiving room 57 is enclosed by the fan carrier 51, the baffle plate 53, the flange 55 and the inclined mounting plate 54. The receiving room 57 communicates with the opening 63 of the mounting bracket 60. The receiving room 57 has width and length larger than those of the mounting bracket 60 so that the mounting bracket 60 can be received in the receiving room 57 of the flow director 50. The outlet 516 of the fan carrier 51 is adjacent to and communicates with the receiving room 57 of the flow director 50. A pair of tabs 532 are formed respectively inclinedly downwardly from the bottom wall 514 of the fan carrier 51 and an inner edge of the inclined mounting plate 54. The tabs 532 are spaced from each other by the receiving room 57 and connected to the baffle plate 53. The tabs 532 abut against opposite ends of the longitudinal body 62 of the mounting bracket 60 when the mounting bracket 60 is received in the receiving room 57.

The thermal module 10 is received in the receiving room 57 of the flow director 50 and contacts with the GPU 94. The thermal module 10 comprises a heat spreader 30, a plurality of fins 20 mounted on the heat spreader 30 and a pair of heat pipes 40 thermally connecting the heat spreader 30 and the fins 20. The heat spreader 30 has a generally rectangular shape and defines four threaded holes 322 at four corners thereof, corresponding to the through holes 652 of the mounting bracket 60. Two pairs of mounting holes 328 are defined in the heat spreader 30 at outside of the fins 20. The heat spreader 30 is mounted on the mounting bracket 60 by extending screws 655 through the through holes 652 to be threadedly engaged in the threaded holes 322 of the heat spreader 30. Four screws 35 extend through the mounting holes 328 of the heat spreader 30 to be threadedly engaged in the upper inner-threaded portions 952 of the fastening members 95, whereby the heat spreader 30 of the thermal module 10 is fastened to the VGA card 90 to contact with the GPU 94. The fins 20 are spaced from and parallel each other. Each of the fins 20 is perpendicular to the heat spreader 30. A length of the fins 20 along the longitudinal direction is longer than that of the heat spreader 30 so that a part of the fins 20 which extends beyond the heat spreader 30 is located on the inclined mounting plate 54 of the flow director 50. Each of the heat pipes 40 comprises an evaporating portion 42 sandwiched between a top of the heat spreader 30 and a bottom of the fins 20 and a condensing portion 44 extending through the fins 20.

The cover 80 comprises a flat top portion 82 having a substantially rectangular shape. A sleeve 83 corresponding to the shaft 536 of the flow director 50 is formed at a longitudinal edge of the top portion 82. The sleeve 83 has a length the same as that of the shaft 536 of the flow director 50 and a bore diameter larger than an outer diameter of the shaft 536. A side frame 84 extends from another opposite longitudinal edge of the top portion 82. The shaft 536 of the flow director 50 is pivotably received in the sleeve 83 of the cover 80 for facilitating rotation of the cover 80 relative to the flow director 50. A pair of wedge-shaped protrusions 840 are formed on the side frame 84 for engaging with the clasps 550. The cover 80 is capable of rotating around the shaft 536 between an opened position and a closed position, wherein FIG. 2 shows the cover 80 in the opened position, and FIG. 3 shows the cover 80 in the closed position. When the cover 80 is closed, the clasps 550 engage with the protrusions 840. When the heat dissipation device of the VGA card assembly in accordance with present invention has a part needing to be repaired, a user only needs to open the cover 80 by rotating the cover 80 from the closed position to the opened position, whereby the heat dissipation device in the receiving room 57 is exposed. Then a user can easily access the heat dissipation device to process with the required repair. Such an operation is quite easy, in comparison with the part art, which requires the user to unscrew a plurality of screws in order to remove the cover.

Figure 4:
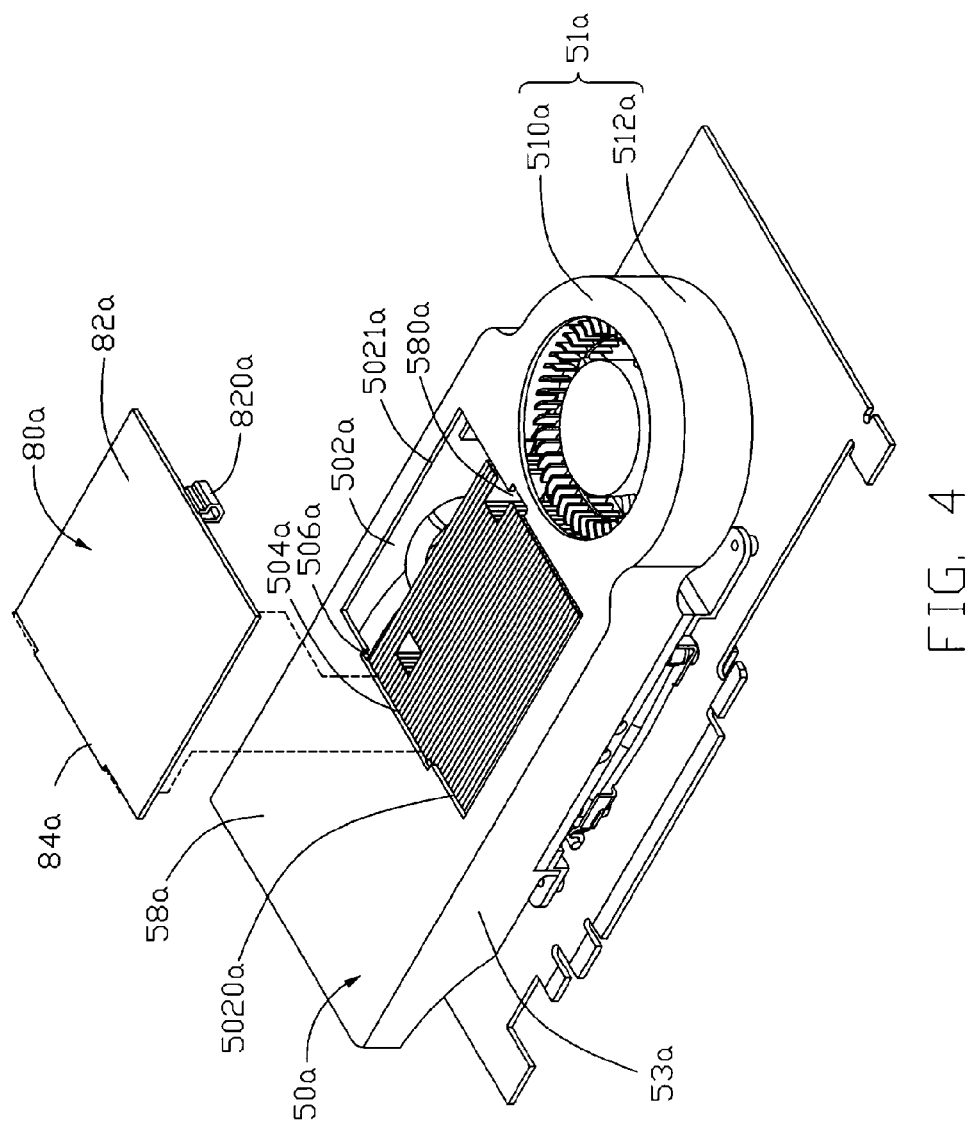
FIG. 4 is a partly assembled view of a VGA card assembly according to a second embodiment of the present invention.
Figure 5:
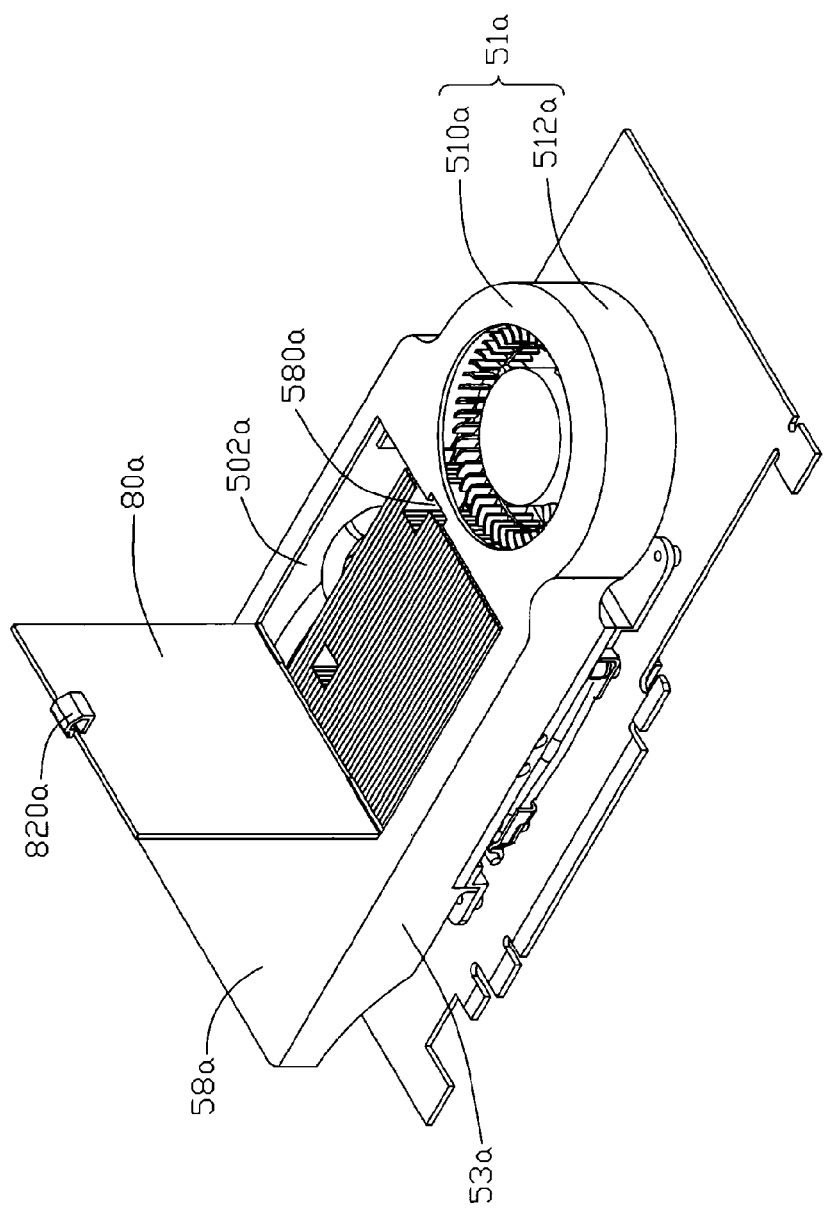
FIG. 5 is an assembled view of FIG. 4, showing a cover of the VGA card assembly in an opened position.
Figure 6:
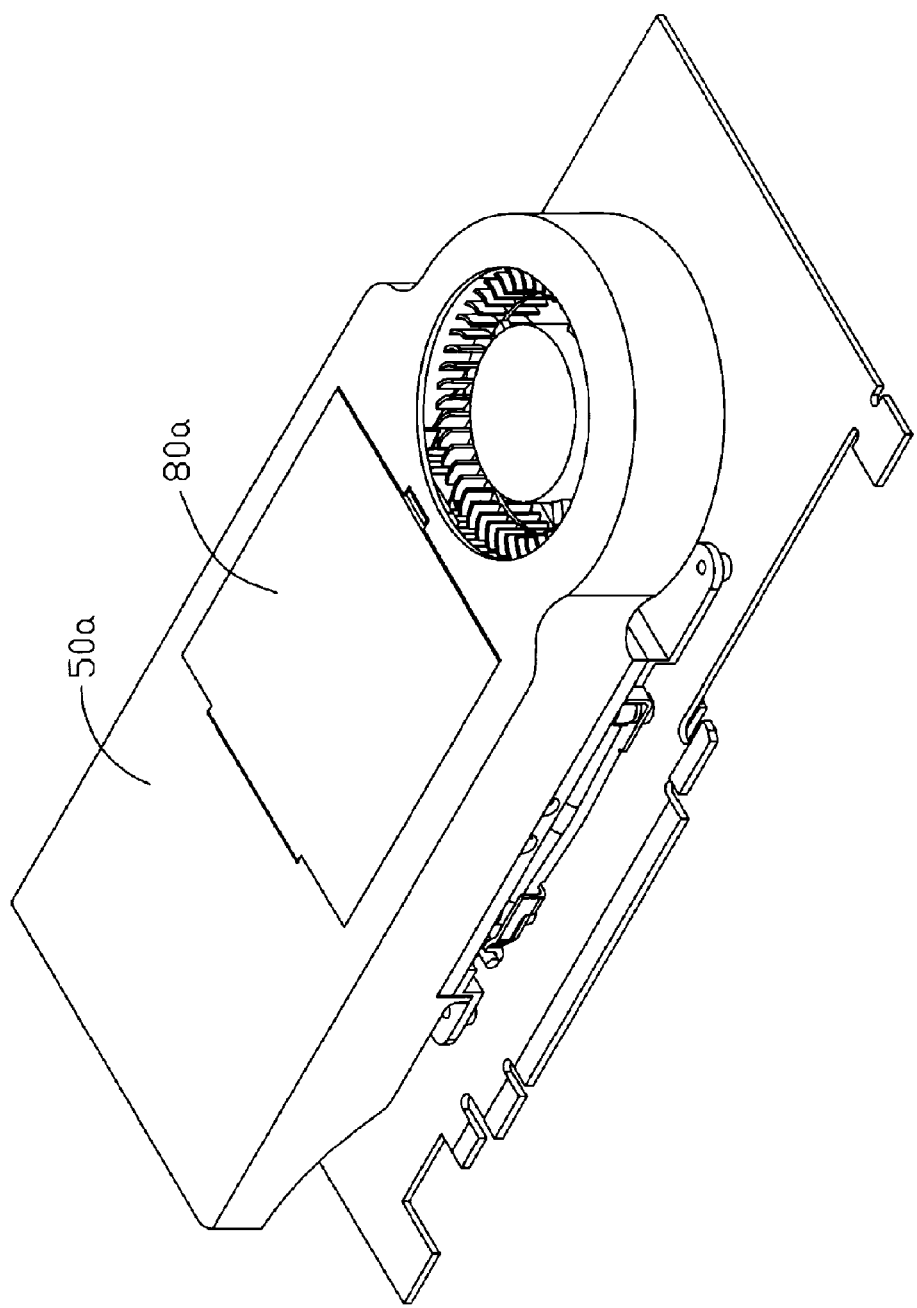
FIG. 6 is a view similar to that of FIG. 5, but showing the cover of the VGA card assembly in a closed position.

FIGS. 4-6 show a VGA card assembly in accordance with a second embodiment of the present invention. The VGA card assembly of the second embodiment is similar to that of the previous first embodiment. However, a flow director 50a replaces the flow director 50 of the first embodiment, and a removable cover 80a replaces the cover 80 of the first embodiment. In the second embodiment, the flow director 50a comprises a fan carrier 51a having the same configuration as that of the first embodiment, a pair of opposite sidewalls 53a connecting free ends of a sidewall 512a of the fan carrier 51a and a top wall 58a connecting with a top wall 510a of the fan carrier 51a and the sidewalls 53a. A rectangular opening 502a is defined in the top wall 58a of the flow director 50a. The opening 502a is enclosed by two pairs of inner edges 5020a, 5021a formed by the top wall 58a of the flow director 50a. One of the lateral inner edges 5020a adjacent to the fan carrier 51a defines a cutout 580a at a center thereof. A groove 504a is defined at the other lateral inner edge 5020a. A pair of spaced pivot pins 506a are formed by the top wall 58a and extend in the groove 504a. The cover 80a comprises a flat body 82a. The body 82a forms a resilient hook 820a at a lateral side thereof, for being engaged in the cutout 580a of the flow director 50a. A protrusion 84a extends along another lateral side, for being engaged in the groove 504a of the flow director 50a. Two opposite free ends of the protrusion 84a define mounting holes (not shown) engaging with the pivot pins 506a, for providing a pivotable connection between the cover 80a and the flow director 50a. Thus, the cover 80a pivotably rotates relative to the flow director 50a between an opened and closed position. At the closed position, the cover 80a closes the opening 502a.

Figure 7:
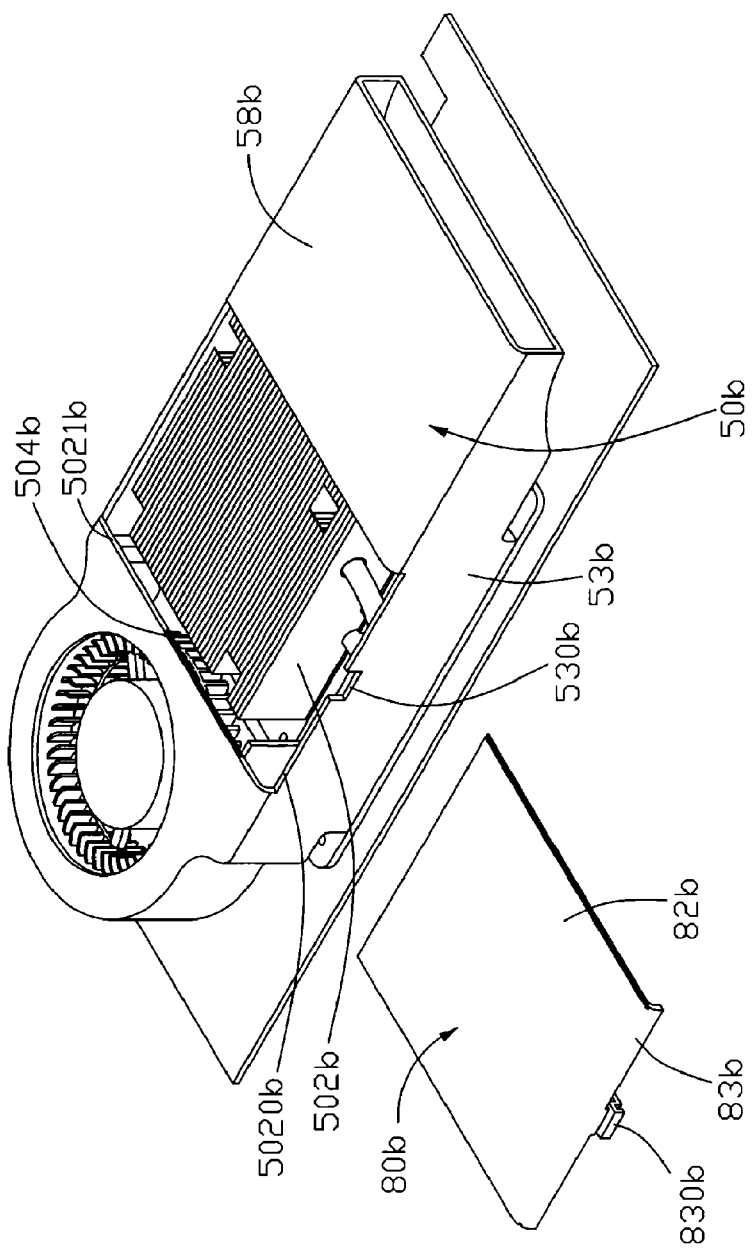
FIG. 7 is a partly assembled view of a VGA card assembly according to a third embodiment of the present invention, showing a cover of the VGA card assembly in an opened position.
Figure 8:
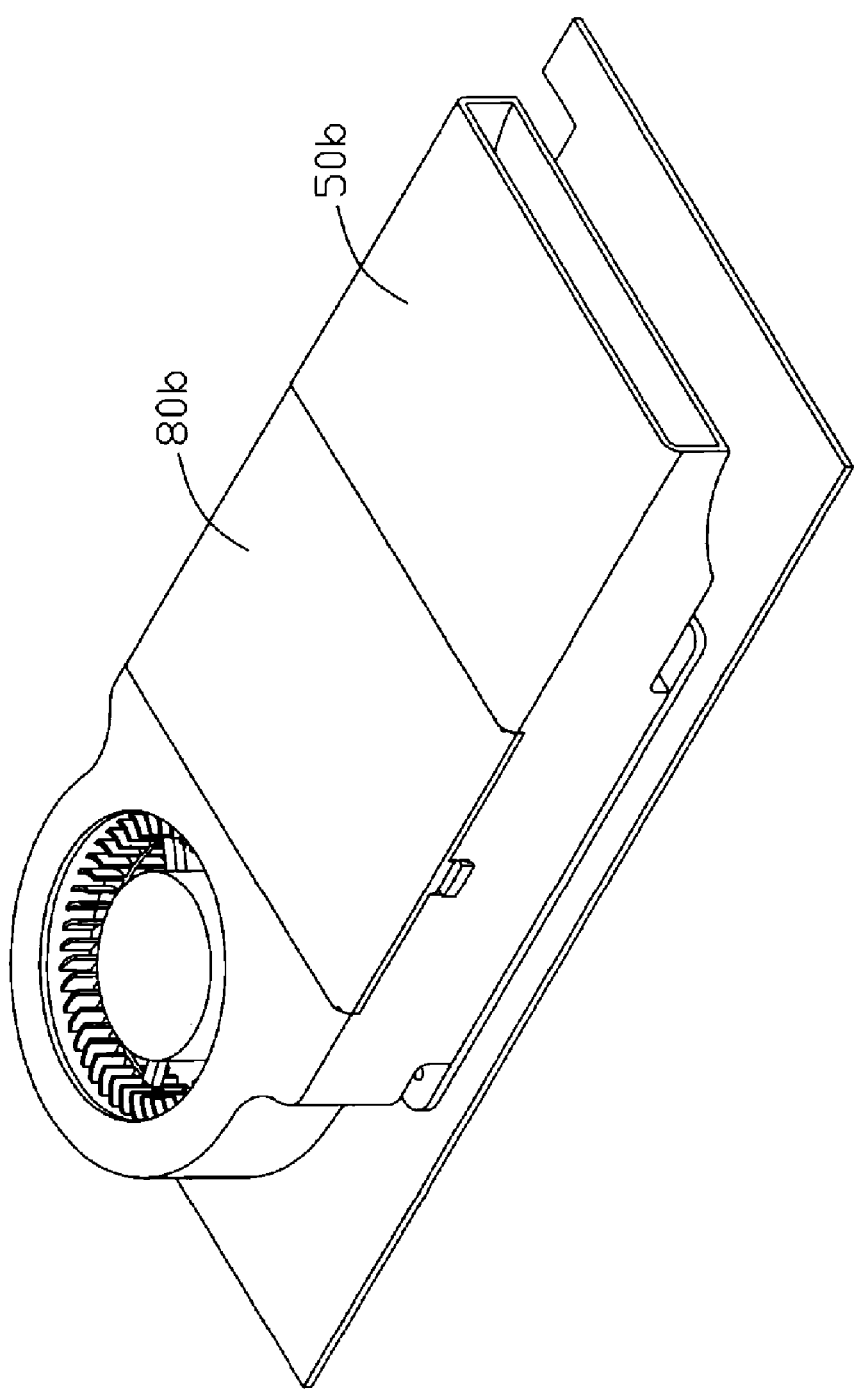
FIG. 8 is an assembled view of FIG. 7, but showing the cover of the VGA card assembly in a closed position.
Figure 9:
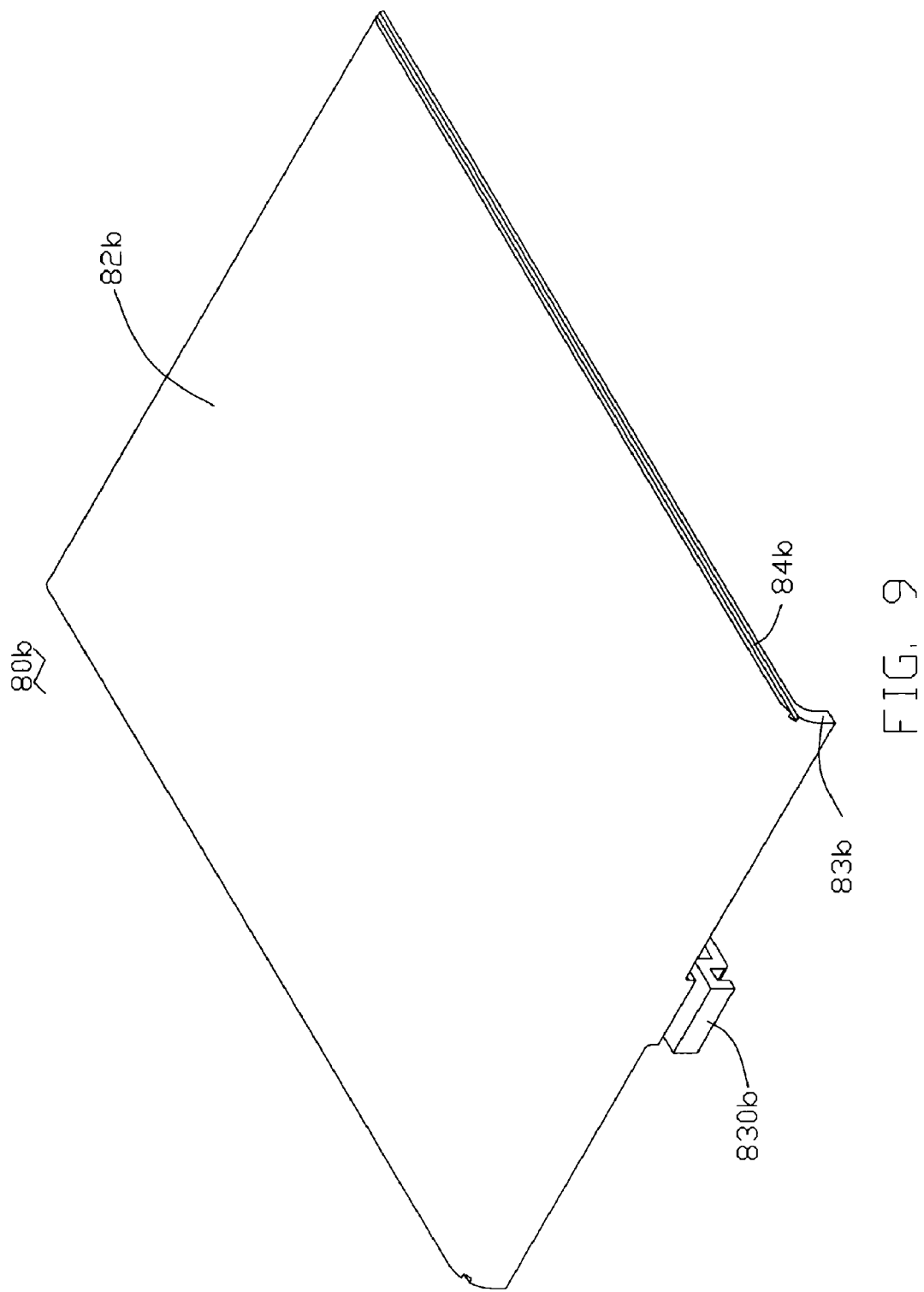
FIG. 9 is a enlarged view of the cover of FIG. 7.

FIGS. 7-8 show a VGA card assembly in accordance with a third embodiment of the present invention. The VGA card assembly of the third embodiment is similar to that of the previous second embodiment. However, a flow director 50b replaces the flow director 50a of the second embodiment, and a removable cover 80b replaces the cover 80a of the second embodiment. In the third embodiment, the flow director 50b defines a substantially rectangular opening 502b. The opening 502b is defined through a top wall 58b of the flow director 50b. The opening 502b is enclosed by two pairs of edges 5020b, 5021b of the flow director 50b. One of sidewalls 53b of the flow director 50b defines a cutout 530b located at a center of one of the pair of edges 5020b. The other pair of edges 5021b form rails 504b extending therealong. The cover 80b comprises a flat body 82b. A flange 83b is bent from a side of the body 82b. The flange 83b forms a hook 830b at a center thereof, for being engaged in the cutout 530b of the flow director 50b. Please referring to FIG. 9, a pair of opposite grooves 84b corresponding to the rails 504b of the flow director 50b are defined in opposite lateral sides of the body 82b, whereby the cover 80b can be slidably received in the opening 502b of the flow director 50b by fitting the rails 504b into the grooves 84b. When the rails 504b are engaged in the grooves 84b, the cover 80b is supported by the flow director 50b. By pushing the cover 80b along the rails 504b to reach a final position, the opening 502b is closed, and simultaneously the hook 830b of the cover 80b is engaged in the cutout 530b of the flow director 50b; thus, the cover 80b is locked at the closed position. To open the opening 502b, a user needs to unsnap the hook 830b from the cutout 530b and withdraw the cover 80b from the flow director 50b.

The cover of the present invention is movably mounted on the flow director. The cover is capable of rotating or sliding relative to the flow director to facilitate open and close of the receiving room 57.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A VGA card assembly comprising:
    a VGA card having a heat-generating electronic component mounted thereon;
    a heat dissipating device mounted on the VGA card, comprising:
    a flow director defining a receiving room therein, the flow director comprising a fan carrier having a fan therein;
    a thermal module received in the receiving room of the flow director and in thermal connection with the heat-generating electronic component;
    a mounting bracket mounted on the VGA card and received in the receiving room of the flow director, the thermal module being mounted on the mounting bracket; and
    a cover movably mounted on the flow director to selectively open and cover the thermal module in the flow director, wherein the cover can be moved between an opened position and a closed position, in the opened position, the thermal module being exposed, in the closed position, the thermal module being enclosed.

2. The VGA card assembly as described in claim 1, wherein a back plate is mounted to a bottom portion of the VGA card.

3. The VGA card assembly as described in claim 2, wherein the back plate forms studs extending upwardly, a plurality of fasteners having upper threaded portions and lower threaded portions, the lower threaded portions extending downwardly through the VGA card to threadedly engage with the studs to thereby securely attach the back plate to the bottom portion of the VGA card.

4. The VGA card assembly as described in claim 3, wherein a plurality of screws extend through the thermal module to threadedly engage with the upper threaded portions of the fasteners, thereby threadedly connecting the thermal module and the VGA card together.

5. The VGA card assembly as described in claim 1, wherein the fan carrier of the flow director comprises a top wall having an intake therein aligned with the fan, a bottom wall spaced from the top wall and an arced sidewall extending downwardly from an edge of the top wall and connecting with the bottom wall.

6. The VGA card assembly as described in claim 5, wherein an outlet is defined at a lateral side of the fan carrier and enclosed by the top wall, the sidewall and the bottom wall of the fan carrier, the outlet being adjacent to and communicating with the receiving room of the flow director.

7. The VGA card assembly as described in claim 1, wherein the thermal module comprises a heat spreader contacting with the heat-generating electronic component, a plurality of fins mounted on the heat spreader and a heat pipe thermally connecting the heat spreader and the fins.

8. The VGA card assembly as described in claim 1, wherein the mounting bracket consists of three elongated bodies and an opening enclosed by three bodies, the thermal module contacting a plurality of second heat-generating electronic components around the heat-generating electronic component, the bodies being provided with a plurality of vanes thereon.

9. The VGA card assembly as described in claim 1, wherein the flow director comprises first and second opposite sidewalls and a mounting plate connecting the first and second sidewalls, the first and second sidewalls extending from two opposite ends of a sidewall of the fan carrier.

10. The VGA card assembly as described in claim 9, wherein a pair of opposite tabs inclinedly, downwardly extend from two opposite sides of the receiving room of the flow director, the tabs abutting against the mounting bracket.

11. The VGA card assembly as described in claim 9, wherein a shaft is formed on a top edge of the first sidewall of the flow director, a sleeve formed on an edge of the cover for pivotably receiving the shaft therein, whereby the cover is capable of rotating around the shaft of the flow director between the opened and closed position.

12. The VGA card assembly as described in claim 11, wherein a clasp is formed on the second sidewall of the flow director, and a protrusion is formed on the cover for engaging with the clasp of the flow director when the cover is located at the closed position.

13. The VGA card assembly as described in claim 9, wherein the flow director comprises a top wall connecting with the first and second sidewalls and a rectangular opening defined in the top wall of the flow director.

14. The VGA card assembly as described in claim 13, wherein one of sides of the opening defines a cutout and the cover forms a resilient hook on an edge thereof, the resilient hook being engaged in the cutout when the cover is located at the closed position.

15. The VGA card assembly as described in claim 14, wherein another one of the sides of the opening opposite to the cutout forms a pair of pivot pins thereon and the cover forms a protrusion defining mounting holes at opposite ends thereof, the pivot pins being pivotably received in the mounting holes of the protrusion of the cover for providing a pivotable connection between the cover and the flow director.

16. The VGA card assembly as described in claim 14, wherein two opposite sides of the opening which are beside the side of the opening defining the cutout form rails thereon and the cover defines a pair of grooves at opposite sides thereof, the cover being slidably received in the opening of the flow director by engaging the rails in the grooves whereby the cover is supported by the flow director.

17. A VGA card assembly comprising:
- a VGA card having a graphics processing unit (GPU) thereon;
- a heat dissipation device mounted on the VGA card and thermally connecting with the GPU;
- a housing mounted to the VGA card and enclosing the GPU and the heat dissipation device therein, wherein the housing has a top wall defining an opening above the heat dissipation device and a cover which is mounted on the housing, and wherein after the cover being mounted on the housing, the cover is movable between an opened position and a closed position, in the closed position, the opening being closed, and in the opened position, the opening being opened.

18. The VGA card assembly as described in claim 17, wherein the VGA card further has a plurality of heat-generating electronic components thereon and around the GPU, the heat dissipation device also thermally connecting with the heat-generating electronic components.

19. The VGA card assembly as claimed in claim 18, wherein the cover is pivotably mounted on the housing.

20. The VGA card assembly as claimed in claim 18, wherein the cover is slidably mounted on the housing.

* * * * *